(12) United States Patent
Schreck

(10) Patent No.: US 6,556,503 B2
(45) Date of Patent: Apr. 29, 2003

(54) METHODS AND APPARATUS FOR REDUCING DECODER AREA

(75) Inventor: John F. Schreck, Lucas, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/934,344

(22) Filed: Aug. 21, 2001

(65) Prior Publication Data

US 2003/0039167 A1 Feb. 27, 2003

(51) Int. Cl.$^7$ ................................................ G11C 8/00
(52) U.S. Cl. .................... 365/230.06; 365/191; 365/226
(58) Field of Search ......................... 365/230.06, 231, 365/191, 104, 189.08, 230.04, 226

(56) References Cited

U.S. PATENT DOCUMENTS

| | | |
|---|---|---|
| 1,550,870 A | 8/1925 | Braden |
| 1,724,307 A | 8/1929 | Peterson |
| 1,935,565 A | 11/1933 | Goetzelman |
| 1,956,196 A | 4/1934 | Korab |
| 2,204,006 A | 6/1940 | Allen et al. |
| 2,288,377 A | 6/1942 | Tuttle |
| 2,398,901 A | 4/1946 | West |
| 2,573,260 A | 10/1951 | Gorman |
| 2,895,634 A | 7/1959 | Comroe |
| 3,015,408 A | 1/1962 | Campbell et al. |
| 3,015,409 A | 1/1962 | Campbell et al. |
| 3,061,083 A | 10/1962 | Hubbell, Jr. |
| 3,253,730 A | 5/1966 | Mount |
| 3,601,276 A | 8/1971 | Culpepper |
| 4,802,121 A | 1/1989 | Schreck et al. ............. 365/104 |
| 4,820,941 A | 4/1989 | Dolby et al. ................ 307/449 |
| 4,858,187 A | 8/1989 | Schreck ....................... 365/185 |
| 4,907,711 A | 3/1990 | Stuchlik, III |
| 4,953,733 A | 9/1990 | Loscuito |
| 4,979,633 A | 12/1990 | Lakey |
| 5,003,128 A | 3/1991 | Grondin |
| 5,012,043 A | 4/1991 | Seymour |
| 5,023,837 A | 6/1991 | Schreck et al. ............. 365/185 |
| 5,132,933 A | * 7/1992 | Schreck et al. ............. 365/104 |
| 5,197,029 A | 3/1993 | Schreck et al. ........ 365/189.01 |
| 5,235,550 A | 8/1993 | Zagar ......................... 365/226 |
| 5,257,238 A | 10/1993 | Lee et al. ............... 365/230.06 |
| 5,287,310 A | 2/1994 | Schreck et al. ........ 365/189.05 |
| 5,287,315 A | 2/1994 | Schreck et al. ............. 365/210 |
| 5,287,536 A | 2/1994 | Schreck et al. ........ 365/230.06 |
| 5,311,480 A | 5/1994 | Schreck ................ 365/230.06 |
| 5,313,432 A | 5/1994 | Lin et al. ............... 365/230.06 |
| 5,367,213 A | 11/1994 | Casper ......................... 327/56 |
| 5,375,728 A | 12/1994 | West |
| 5,491,658 A | * 2/1996 | Schreck et al. ........ 365/185.09 |
| 5,526,952 A | 6/1996 | Green |
| 5,562,222 A | 10/1996 | Jordon et al. |
| 5,602,785 A | 2/1997 | Casper ................... 365/189.11 |

(List continued on next page.)

Primary Examiner—David Nelms
Assistant Examiner—Thong Le
(74) Attorney, Agent, or Firm—Schwegman, Lundberg, Woessner & Kluth, P.A.

(57) ABSTRACT

A circuit designed to hold wordlines inactive when adjacent wordlines are activated to limit errors due to capacitive coupling between wordlines. A space saving technique for maintaining wordlines inactive uses a common gate structure across a plurality of bleed transistors which weakly hold the associated wordlines to an inactive level. The bleed device holds the inactive wordline to an inactive level while consuming a very small current. While the bleed device holds the wordlines inactive with a weak current, the bleed device hold may be overcome by other devices driving the wordlines active with strong drive currents. The use of modulated control of bleed devices is based upon the physical arrangement and proximity of adjacent wordlines such as in odd/even layouts of wordline architectures.

40 Claims, 9 Drawing Sheets

U.S. PATENT DOCUMENTS

| | | |
|---|---|---|
| 5,639,991 A | 6/1997 | Schuette |
| 5,691,951 A | 11/1997 | Rupp ................... 365/230.06 |
| RE35,825 E | 6/1998 | Zager ........................ 365/226 |
| 5,773,760 A | 6/1998 | Stark et al. |
| 5,898,637 A | 4/1999 | Lakhani et al. ........ 365/230.06 |
| 5,912,837 A | 6/1999 | Lakhani ................ 365/185.02 |
| 5,959,897 A | 9/1999 | Chevallier et al. ..... 365/185.33 |
| 5,986,474 A * | 11/1999 | Chung et al. .................. 326/86 |
| 5,991,225 A | 11/1999 | Forbes et al. .......... 365/230.06 |
| 5,995,423 A | 11/1999 | Lakhani et al. ............. 365/200 |
| 5,999,480 A | 12/1999 | Ong et al. ............. 365/230.06 |
| 6,038,159 A | 3/2000 | Raad ............................ 365/51 |
| 6,047,352 A | 4/2000 | Lakhani et al. ................ 711/5 |
| 6,055,192 A * | 4/2000 | Mobley ................ 365/189.11 |
| 6,075,737 A | 6/2000 | Mullarkey et al. .......... 365/207 |
| 6,111,774 A | 8/2000 | Shirley ........................ 365/51 |
| 6,153,468 A | 11/2000 | Forbes et al. ................ 438/257 |
| 6,166,329 A | 12/2000 | Oliver et al. |
| 6,236,606 B1 | 5/2001 | Mullarkey et al. .......... 365/207 |
| 6,243,311 B1 | 6/2001 | Keeth ......................... 365/206 |
| 6,310,802 B1 * | 10/2001 | Ma et al. ............... 365/189.06 |

\* cited by examiner

METHODS AND APPARATUS FOR REDUCING DECODER AREA

TECHNICAL FIELD

The present invention relates generally to semiconductor integrated circuits. More particularly, it pertains to a decoder circuit of reduced size for use in addressing memory bits in integrated memory circuits.

BACKGROUND OF THE INVENTION

Semiconductor memory devices are integrated circuits in which information may be stored and from which information may be extracted when desired. Each memory device is built from a plurality of memory cells in which each memory cell memorizes one binary bit of data. Although a bit of data seems insignificant, modern memory devices contain billions of memory cells to store billions of bits of information.

Modern memory device are of a variety of types such as a dynamic random access memory (DRAM), static random access memory (SRAM), video random access memory (VRAM), erasable programmable read only memory (EPROM), electrically erasable and programmable read only memories (EEPROMS), dynamic electrically alterable programmable read only memory (DEAPROM), flash memory, or other semiconductor memory devices. As these devices become more sophisticated, they require more and more memory in order to keep pace with the increasing complexity of software based applications that run on the systems. Thus, as the technology relating to memory devices has evolved, designers have tried to increase the density of the components of the memory device. For example, the electronics industry strives to decrease the size of memory cells that store the data in the memory device. This allows a larger number of memory cells to be fabricated without substantially increasing the size of the semiconductor wafer used to fabricate the memory device.

Memory devices store data in vast arrays of memory cells. Essentially, the cells are located at intersections of wordlines and bitlines (rows and columns of an array). Each cell conventionally stores a single bit of data as a logical "1" or a logical "0" and can be individually accessed or addressed. Conventionally, each cell is addressed using two multi-bit numbers. The first multi-bit number, or row address, identifies the row of the memory array in which the memory cell is located. The second multi-bit number, or column address, identifies the column of the memory array in which the desired memory cell is located. Each row address/column address combination corresponds to a single memory cell.

To access an individual memory cell, the row and column addresses are applied to inputs of row and column decoders, respectively. Conventionally, row and column decoders are fabricated using programmable logic arrays. These arrays are configured so as to select desired word and bit lines based on address signals applied to the inputs of the array. As with the array of memory cells, the decoder arrays use a portion of the surface area of the semiconductor wafer. Thus, designers also strive to reduce the surface area required for the decoder arrays.

Memory devices are fabricated using photolithographic techniques that allow semiconductor and other materials to be manipulated to form integrated circuits as is known in the art. These photolithographic techniques essentially use light that is focussed through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a memory device, including the decoder array. In order to keep up with the demands for higher capacity memory devices, designers search for other ways to reduce the size of the components of the memory device, including the decoder array.

As a result, the semiconductor memory devices are becoming more and more complex as the industry continues to increase the capacity of memory devices while at the same time reducing the size of the components which make up the semiconductor memory devices. The increase in capacity of memory devices is partly due to the shrinking of the components fabricated on the semiconductor die into smaller and smaller dimensions. For example, the smallest defined feature size (F) of some semiconductor memories is in the submicron range. In addition to shrinking the feature size of the circuits of semiconductor memories, optimizing the design for circuits also contributes to increased capacity for semiconductor memory devices. For example, efficient ways to implement electronic circuitry in semiconductor devices which minimize their required area on the semiconductor surface can result in space savings which can be used to increase the number of memory bits (mbits) that can be packaged in a memory device.

Because semiconductor memory devices such as dynamic random access memory (DRAM) devices are highly ordered in regular arrays, photolithographic duplication of memory cells and the circuits which access, read and write the memory cells is one way in which these circuits are manufactured. For example, a simple 3-to-8 line decoder circuit used for address decoding may be duplicated thousands of times within a semiconductor memory device. Thus, an area savings of one transistor can result in a total area savings on a semiconductor memory device of 1,000 times the area of the one transistor saved. Thus, incremental advances in the packing density of components of semiconductor memory devices can result in large advances in the total packing density and increased capacity of memory devices.

As the memory devices shrink in physical dimensions, and the electrical components on the integrated circuit are manufactured closer together, the issue of electrical noise becomes an increasing problem. For example, a wire internal to an integrated circuit may switch from a low voltage to a high voltage which may cause an adjacent wire to momentarily rise in voltage due to capacitive coupling between the wires. This increase in noise due to proximity and capacitive coupling must also be addressed as the packing density increases and the dimensions decrease.

There is a need in the art for increasing the capacity and density of memory devices and at the same time decreasing the area of components used to make up semiconductor memory devices to allow increased memory bit capacities for memories. There is also a need to address on-chip noise problems which arise due to the increased packing density.

SUMMARY OF THE INVENTION

The above-mentioned problems with memory devices and other problems are addressed by the present invention and will be understood by reading and studying the following specification. Devices and methods are described which accord these benefits.

The present invention describes several embodiments which are designed to hold unselected decoder output lines, such as wordlines, to a voltage or ground when adjacent wordlines are selected to limit errors due to sympathetic capacitive coupling between wordlines. In one illustrative embodiment, a space saving technique for maintaining wordlines in unselected states is comprised of a common gate structure utilized across a plurality of bleed transistors which weakly pull or hold the associated wordlines to an unselected voltage level. In other embodiments, the bleed device holds the unselected wordline to an voltage or ground level while consuming a very small current. While the bleed device holds the wordlines to the unselected voltage level with a weak current, the bleed device hold may be overcome by other devices driving the wordlines with strong drive currents. Other embodiments include the use of modulated or changing control voltages on the bleed signal of the bleed devices based upon the physical arrangement and proximity of adjacent wordlines such as odd/even layouts of wordline architectures.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
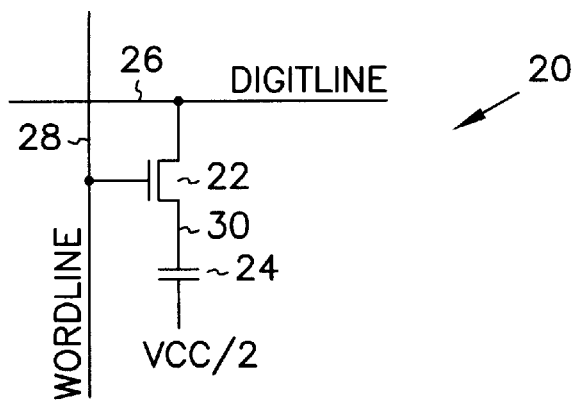
FIG. 1 is a schematic diagram of a dynamic random access memory (DRAM) memory cell or memory bit.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention as defined by the claims and their equivalents.

In this description, the terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The illustrative embodiments described herein concern electrical circuitry which uses relative voltage levels to represent binary logic states—namely, a "high" logic level and a "low" logic level, by voltages which are high and low. Further, electronic signals used by the various embodiments of the present invention are generally considered to be ON or in a selected state when they are at a high voltage. However, an asterisk (*) following the signal name or an overbar ( ¯ ) over a signal name in this application indicates that the signal is negative or inverse logic. Negative or inverse logic is considered ON or selected when the signal is low, or in a low voltage. Normally, logic signal are selected when at a high voltage unless stated otherwise.

A signal is that is termed "active" is at a low impedance or high current state in which the signal may source or sink a high current level. An active signal is said to be selected and may have a high or low voltage. A signal may be "inactive" or in a low-current state when it is not selected (unselected), and it may be at a voltage level which is weakly driven or may be allowed to "float" to any voltage level. An inactive signal line may be subject to noise due to capacitive or inductive coupling from adjacent signal lines.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

Supply voltages are those conventionally used in the semiconductor industry although voltage magnitudes can change. For example, Vcc is a positive voltage supply relative to Vss which is typically at ground potential. Vbb is used to describe a substrate bias voltage which is typically set at a negative potential below Vss. Sometime "pumped" voltage levels are used in which a supply voltage Vccp is at a greater potential with references to Vss than Vcc.

DRAM Design

The following described embodiments of the present invention are described as applied to a dynamic random access memory (DRAM), however, those skilled in the art will readily recognize that the present invention may be practiced with a wide variety of memory types. The use of a DRAM memory design as a foundation for the present invention is by way of illustration only and not by limitation. For clarity, only a portion of the well known circuitry of the DRAM is described herein, while the new circuitry of the DRAM of the present invention is described in detail herein.

A DRAM memory cell or memory bit is schematically illustrated generally at 20 in FIG. 1. Memory cell 20 comprises an access transistor 22 and a capacitor 24. Memory cell 20 is capable of holding binary information in the form of stored charge on capacitor 24. Transistor 22 operates as a switch coupled between capacitor 24 and a digit line 26. Capacitor 24 includes a common node which is biased at approximately Vcc/2 or at the cell plate voltage. The gate which controls the switching action of transistor 22 is coupled to a word line 28. A logic ONE binary value is stored in memory cell 20 by having a plus Vcc/2 charge across capacitor 24. A logic ZERO binary value is stored in memory cell 20 by having a minus Vcc/2 charge across capacitor 24. Thus, a node 30, representing the connection between transistor 22 and capacitor 24, is at a potential equal to Vcc when a logic ONE value is stored in memory cell 20 and is at a zero or a ground level potential when a logic ZERO value is stored in memory cell 20.

Figure 2:
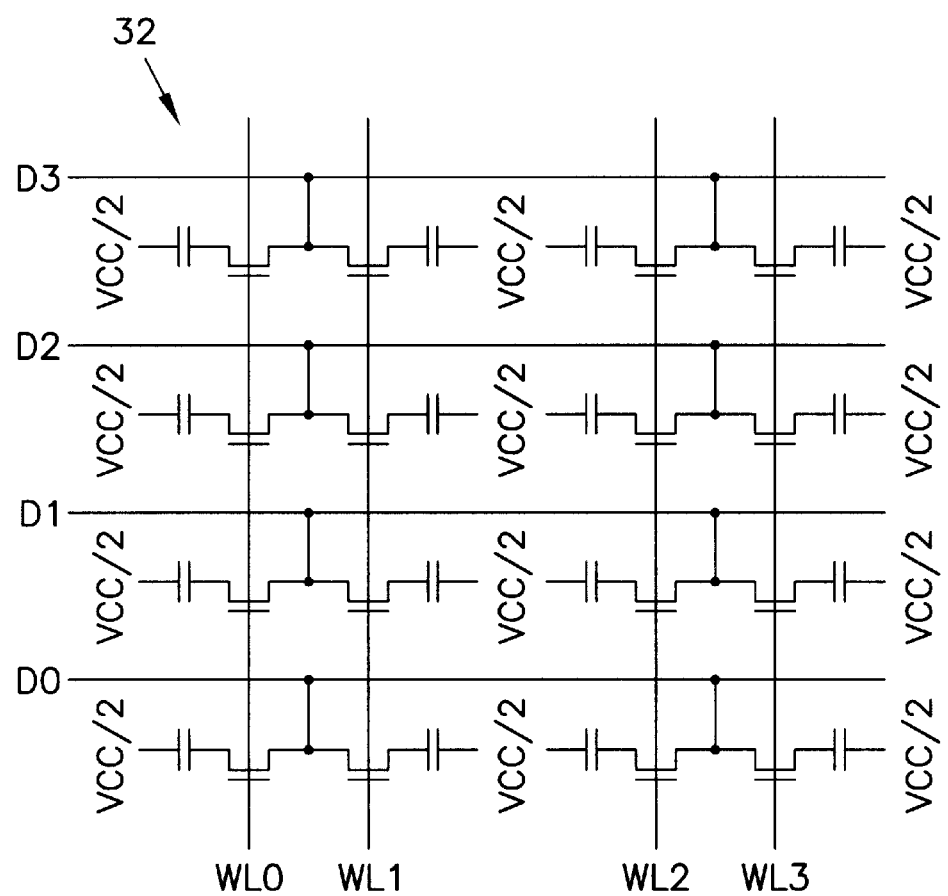
FIG. 2 is schematic diagram of a simplified memory array structure of a DRAM.

Memory arrays in DRAMs are formed by tiling a large number of memory cells 20 into a memory array structure 32 as schematically illustrated in FIG. 2. In memory array structure 32, the memory cells along a given digit line (D0, D1, D2, or D3) do not share a common word line (WL0, WL1, WL2, or WL3) and memory cells along a common word line do not share a common digit line. The simplified diagram of memory array structure 32 in FIG. 2 is for illustrative purposes only to show how the one transistor/one capacitor memory cells are employed in an array structure which is easily scaled. Although the design of the DRAM memory cells and memory arrays may appear simple, their actual design and implementation are highly complex.

Figure 3:
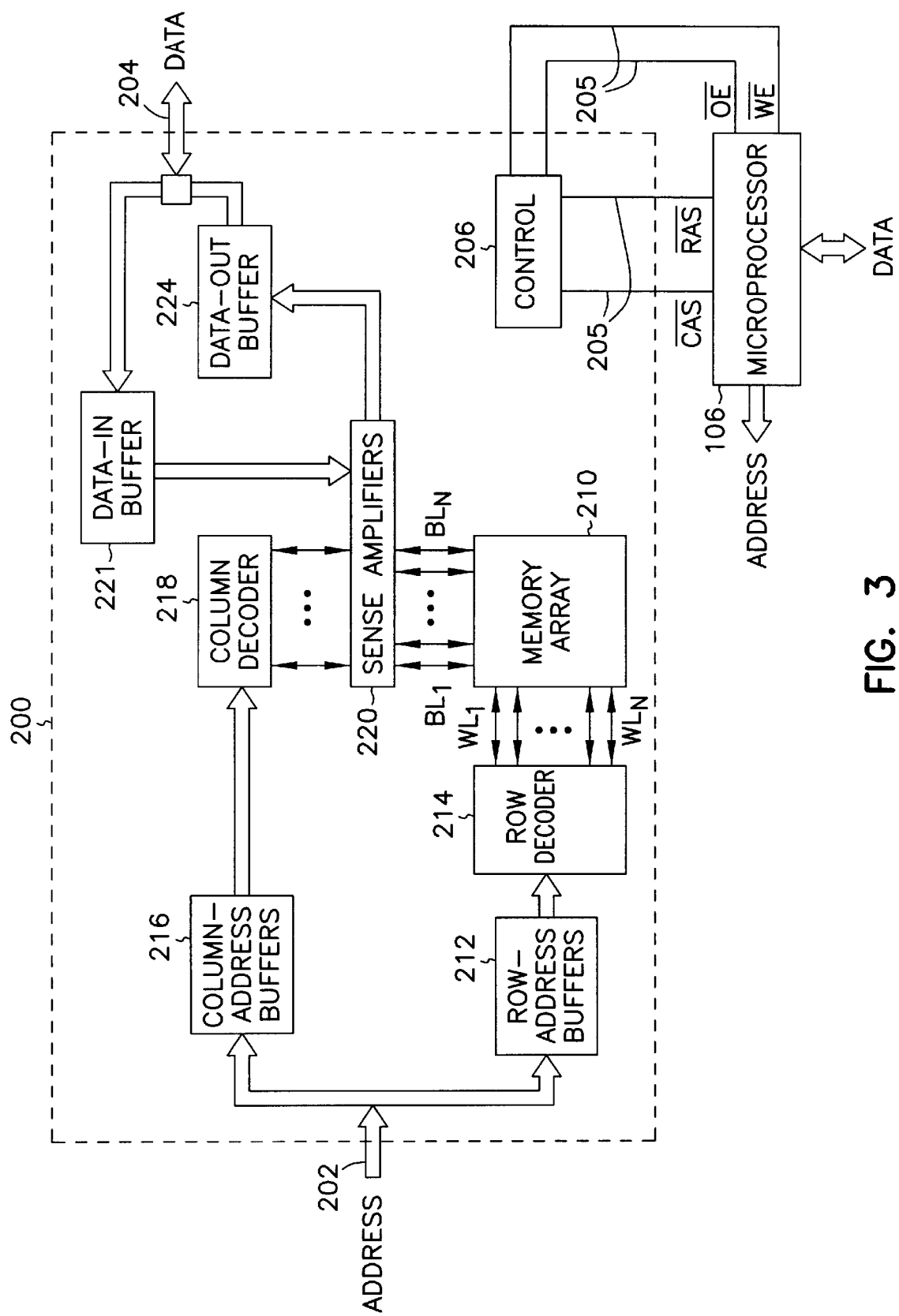
FIG. 3 is a block diagram illustrating generally an embodiment of an architecture of a memory circuit.

FIG. 3 is a block diagram that illustrates the major components of an integrated circuit memory device, such as a DRAM. The description of the memory device of FIG. 3 has been simplified for purposes of illustrating a DRAM memory device incorporating the present invention and is not intended to be a complete description of all the features of a memory device. Address information is provided on input line 202, data information is provided on input/output line 204, and control input is provided on a variety of input lines 205 directed to a control logic 206.

The DRAM 200 includes a memory array 210 which in turn comprises rows and columns of addressable memory cells. Each memory cell in a row is coupled to a common wordline, as illustrated by lines $WL_1$–$WL_n$. Additionally, each memory cell in a column is coupled to a common bitline, as illustrated by lines $BL_1$–$BL_n$. Each cell in the memory array 210 includes a storage capacitor and an access transistor, and may include a number of memory subarrays.

The DRAM 200 interfaces with, for example, the microprocessor 106 through address lines 202 and data lines 204. Alternatively, DRAM 200 may interface with a DRAM controller, a micro-controller, a chip set or other electronic system. The microprocessor 106 also provides a number of control signals to the DRAM 200 via the control lines 205, including but not limited to, row and column address strobe signals RAS* and CAS*, write enable signal WE*, an output enable signal OE* and other conventional control signals.

A row address buffer 212 and a row decoder 214 receive and decode row addresses from row address signals provided on address lines 202 by, for example, the microprocessor 106. Each unique row address corresponds to a row of cells in the memory array 210. The row decoder 214 includes a wordline driver, an address decoder tree, and circuitry which translates a given row address received from the row address buffers 212 and selectively activates the appropriate wordline of the memory array 210 via the wordline drivers.

A column address buffer 216 and a column decoder 218 receive and decode column address signals provided on the address lines 202 by the microprocessor 106. Each unique column address corresponds to a column of cells in the memory array 210. The column decoder 218 is coupled to sense amplifiers 220. The sense amplifiers 220 are coupled to bitlines of the memory array 210.

The sense amplifiers 220 are coupled to a data-in buffer 221 and a data-out buffer 224. The data-in buffers 221 and the data-out buffers 224 are coupled to the data lines 204. During a write operation, the data lines 204 provide data to the data-in buffer 221. The sense amplifier 220 receives data from the data-in buffer 221 and stores the data in the memory array 210 as a charge on a capacitor of a cell at an address specified on the address lines 202.

During a read operation, the DRAM 200 transfers data to microprocessor 106 from the memory array 210. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of the sense amplifiers 220 detects and amplifies a difference in voltage between the complementary bitlines. The sense amplifier passes the amplified voltage to the data-out buffer 224.

The control logic 206 is used to control the many available functions of the DRAM 200. In addition, various control circuits and signals not detailed herein initiate and synchronize the DRAM 200 operation as known to those skilled in the art. As stated above, the description of DRAM 200 has been simplified for purposes of illustrating the present invention and is not intended to be a complete description of all the features of a DRAM.

Bitlines $BL_1$–$BL_n$ are used to write to and read data from the memory cells within the memory array 210. The wordlines $WL_1$–$WL_n$ are used to access a particular row of the memory cells that is to be written or read. The row decoder 214 and the column decoder 218 selectably access the memory cells in response to address signals that are provided on the address lines 202 from the microprocessor 106 during write and read operations.

In operation, the DRAM memory 200 receives an address of a particular memory cell at the address buffers 212 and 216. For example, the microprocessor 106 may provide the address buffers 212 and 216 with the address for a particular cell within the memory array 210. The row address buffer 212 identifies wordline $WL_1$, for example, for the appropriate memory cell to the row decoder 214. The row decoder 214 selectively activates the wordline $WL_1$ to activate an access transistor of each memory cell connected to the wordline $WL_1$. The column address buffer 216 identifies bitline $BL_1$, for example, for the appropriate memory cell to the column decoder 218. The column decoder 218 selectively connects a particular sense amplifier to the I/O bitlines for read or write purposes.

Figure 4:
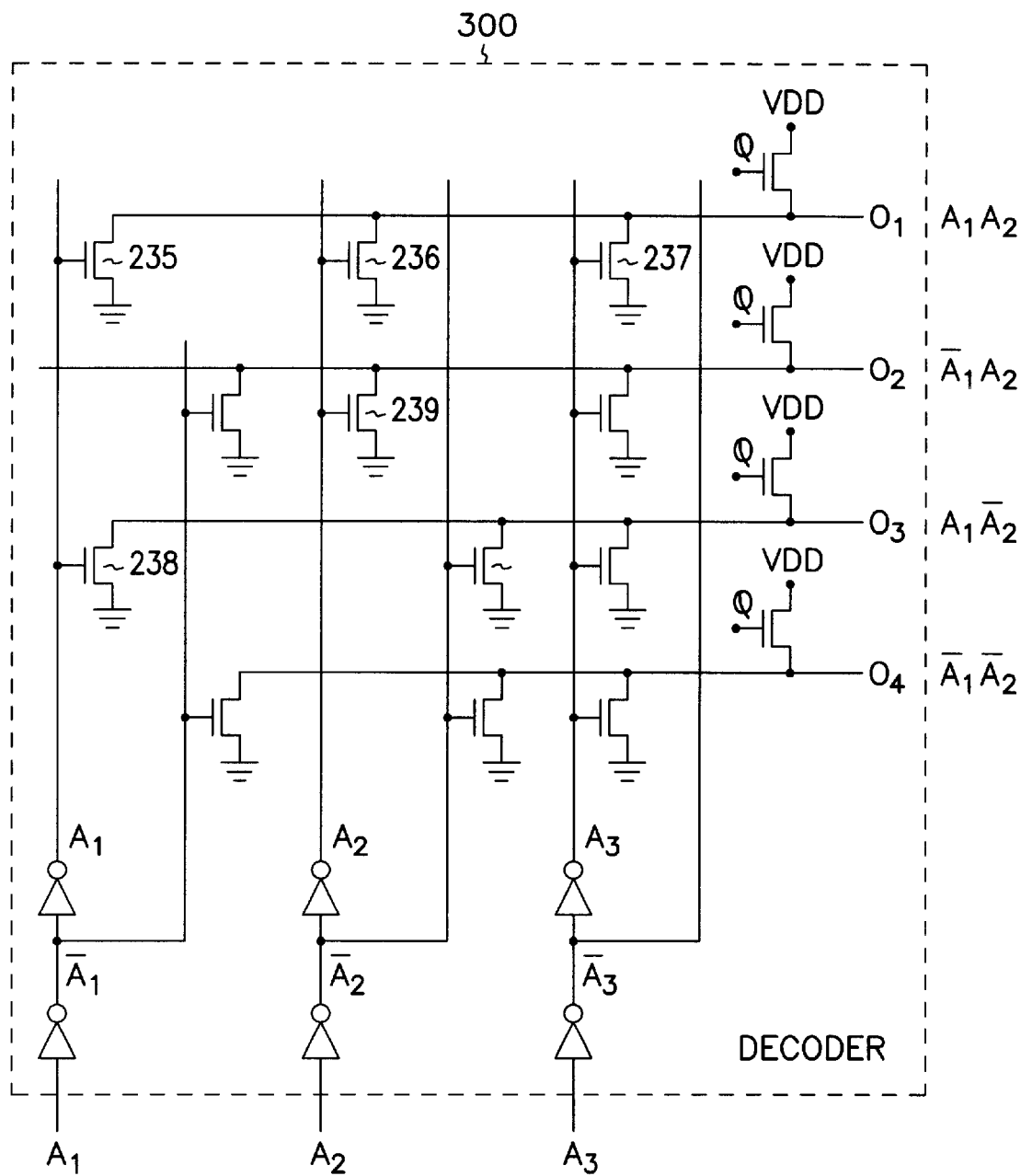
FIG. 4 is a schematic diagram illustrating generally an architecture of one embodiment of an address decoder.

FIG. 4 is a simple schematic diagram that illustrates a portion of a row address decoder, indicated generally at 300. Decoder 300 can be used, for example, as a memory address decoder such as column decoder 218 or row decoder 214 of FIG. 3. Decoder 300 of FIG. 4 includes a number of transistors that are formed at the intersection of output lines $O_1$ through $O_4$ with either an address line $A_1$ through $A_3$ or inverse address line $\overline{A}_1$ through $\overline{A}_3$. The inverse address lines are coupled to associated address lines through an inverter as shown. For example, transistor 235 is located at the intersection of address line $A_1$ and output line $O_1$. Address $A_1$ through $A_3$ is a 3-bit address which decodes to eight select lines, only one of which is active at any given time. For simplicity, FIG. 4 only shows four of the eight decode output lines. Generally speaking, decoder 300 can be fabricated with N address input lines to uniquely select $2^N$ output lines.

Figure 5:
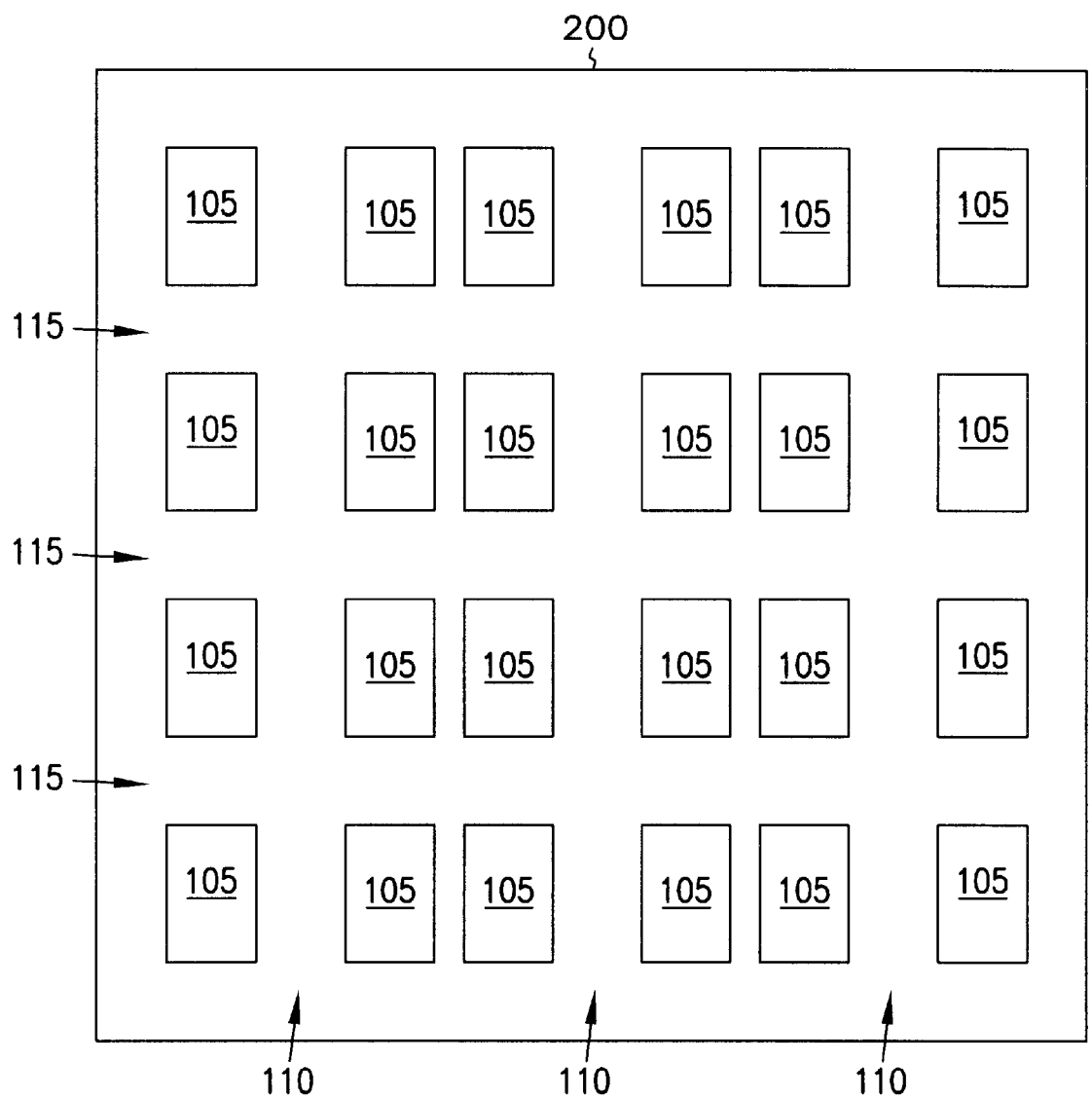
FIG. 5 is a floorplan block diagram that illustrates the layout architecture of a conventional DRAM.

FIG. 5 is a floorplan block diagram that illustrates the architecture of a conventional DRAM 200, which typically includes a matrixed arrangement of multiple memory cell arrays or subarrays 105, each of which is understood to contain a matrixed arrangement of memory cells. As bit densities for integrated circuit memories increase, the memory arrays or subarrays are designed to be hierarchical in nature, having subarrays composed of sub-subarrays, and so on. To address this hierarchical arrangement of memories, local word lines, bit lines, and sense amplifiers are controlled by a hierarchy of control signals such as global word lines or main word lines, etc. Hence the address decoding structure is made hierarchical as the number of arrays, subarrays and sub-subarrays are implemented.

The interstitial separations between the memory cell subarrays 105 carry support circuits for addressing the memory cells in the memory cell subarrays 105, such as for performing reading and writing operations, and include areas for decoders. The interstitial separations include longitudinal streets 110 and latitudinal streets 115.

Longitudinal streets 110 typically include column decoder and sense amplifier circuits, which together are adjacent to or interposed between ones of memory cell subarrays 105. The column decoder and sense amplifier circuits are used for reading data from and writing data to selected digit lines, which are in the memory cell subarrays 105 and are coupled to memory cells therein. Latitudinal streets 115 typically include row decoders that are adjacent to or interposed between ones of memory cell subarrays 105. The row decoder circuits are used for selectively activating word lines in a memory cell array 105 for accessing memory cells therein.

The column decoder and sense amplifier circuits in the longitudinal streets 110 and the row decoder circuits in the latitudinal streets 115 are sometimes referred to collectively as "pitch cell" circuits, because such circuits are laid out on the same pitch (spacing between adjacent ones) of the digit lines and word lines to which they are respectively coupled. The interstitial separations between memory cell subarrays 105 occupy a considerable portion of the integrated circuit DRAM. In order to improve storage density, for reducing the component size of integrated circuit DRAM 200 or for increasing the data storage capability of integrated circuit DRAM 200, the magnitude of the interstitial separations between memory cell subarrays 105 should be decreased, such as by electrical circuit design or physical layout design techniques. As such, reductions in the size of decoders in the interstitial spaces allows more room for increased numbers and densities of memory subarrays 105.

Word Line Decoders

In keeping with the hierarchical nature of the memory device having arrays and subarrays of memory bits, we have the concept of local wordlines and main wordlines. Local wordlines are driven by the decoded addresses that operate within the particular subarray while a global wordline is a wordline that operates between subarrays. A problem with dense memory subarrays is that capacitive coupling between long wordlines can cause adjacent wordlines to bounce or become temporarily active upon the activation of capacitively coupled wordline. Thus, the wordlines must be held high or held low to prevent capacitive coupling and sympathetic voltage swings between wordlines.

Figure 6:
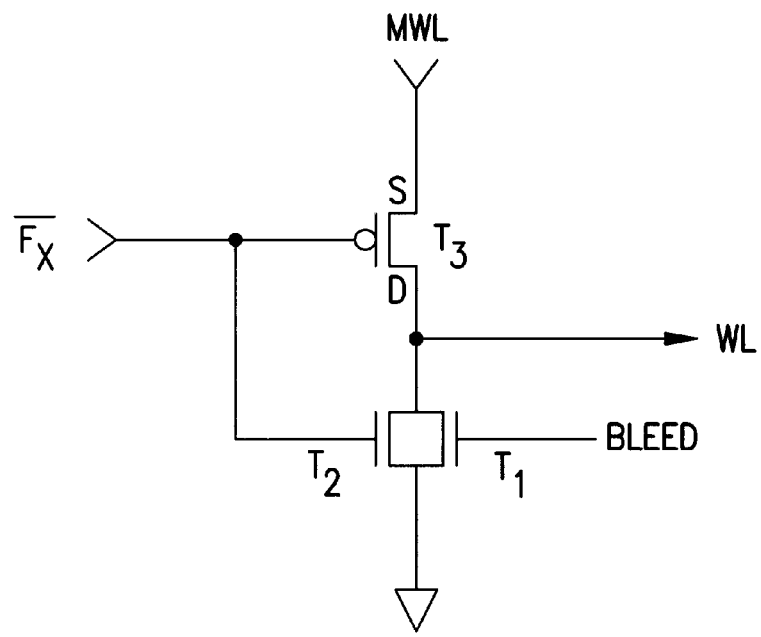
FIG. 6 is an electrical schematic diagram of a portion of a wordline driver of one embodiment of the present invention.

A wordline driver of one embodiment of the present invention is shown in FIG. 6 in which signals MWL and $\overline{F}_X$ are pre-decoded address signals for a row decoder. The main wordline MWL is a global wordline which must be activated in order to activate a given group of rows of memory cells on several subarrays while the local wordline WL also needs to be active to activate a particular row within a particular subarray. The decoded address signal $\overline{F}_X$ is a low-active signal going to the local row decoder which in conjunction with the MWL signal would cause the wordline signal WL to become active to access a particular row in the memory subarray 105. In operation, p-channel transistor $T_3$ operates to pull the wordline WL to a high (active) potential when MWL is high (active) and $\overline{F}_X$ is low (active). If $\overline{F}_X$ or MWL are not both active, then the wordline WL must be pulled and held to a low (unselected) voltage potential to prevent the word line WL from floating or bouncing due to adjacent word lines going active. When $\overline{F}_X$ is high (unselected), n-channel transistor $T_2$ will pull the wordline WL to ground. If, however, $\overline{F}_X$ is low (active) but main wordline MWL is low (unselected), a means of maintaining the wordline WL to a low (unselected) level is needed.

One technique to maintain the wordline WL low is to use the inverse of MWL (labeled MWL*) for this particular wordline WL to pull the wordline to ground through transistor To. However, an inverter takes up a significant amount of chip real estate in order to guarantee the coupling of the unselected wordline WL to ground. One would more likely route the inverse of the signal MWL instead of having a local inverter.

In one embodiment of the present invention, a very small area is used to hold the wordline WL low by means of a common gate transistor $T_1$ as shown in FIG. 6. Transistor $T_1$ is a device that shares a common gate between a long string of decoder devices of the type shown in FIG. 6. A common gate structure is similar to the common gate structure used for wordlines in which a single wordline may cover the active gate areas of a long row of access transistors. In this fashion, a conductor may pass over the gate areas of a long series of transistors such as $T_1$ to hold wordlines low.

The gate voltage of transistor $T_1$ is a signal designated BLEED which has a chosen voltage value such that a small gate signal on transistor $T_1$ will allow a small current flow which will hold the wordline WL at ground when the decoder of FIG. 6 is not selected. The not-selected condition may be, for example, $\overline{F}_X$ low (active) and MWL low (unselected) which would need transistor $T_1$ to be ON and allow a small current flow to hold WL at ground. The BLEED signal may be a quiescent signal or it may be a modulated signal. As a quiescent signal, the bleed device is always on to weakly hold the wordline at ground. The weakly held state can be overcome by strongly pulling the wordline active. As a modulated signal, the bleed device is only activated when another wordline is activated so that the bleed device associated with the non-selected wordline is activated to hold the non-selected wordline low.

One of the design considerations of the present invention is to choose the gate voltage level of the BLEED signal such that the wordline WL may be pulled high to overcome the current through $T_1$ such that the active voltage of WL will be very close to the MWL voltage when the WL is high. The level must be chosen so that the current through $T_1$ is large enough to prevent coupling wordline WL above ground when an adjacent wordline goes high, and small enough to allow transistor $T_3$ to overcome $T_1$ and pull the wordline to the MWL level. Thus, the BLEED signal weakly holds the deselected wordline WL to a low level. With a common gate structure, all deselected wordlines may be weakly held to a voltage level to indicate that the wordline is not selected.

Figure 7:
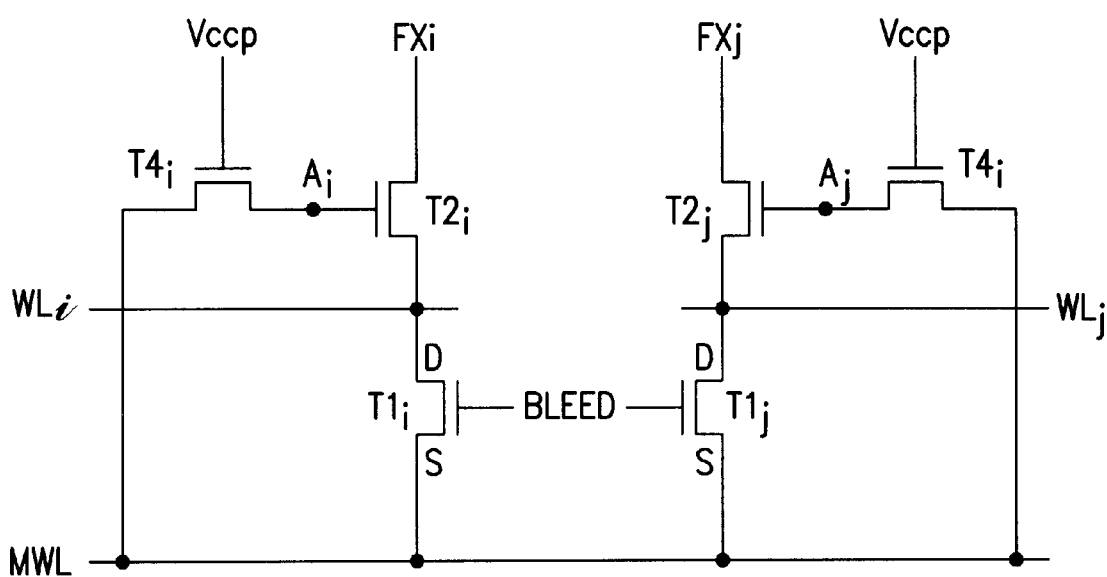
FIG. 7 is an electrical schematic diagram of a portion of a wordline driver of another embodiment of the present invention.

FIG. 7 shows an NMOS decoder implementation which shares the main wordline MWL with adjacent decoders that have different wordlines WL and different decoded $\overline{F}_X$ signals. The BLEED signal shares a common gate among all $T_1$ transistors. This configuration saves additional space over the configuration of FIG. 6 since it is an all-NMOS implementation. By eliminating the p-channel transistor $T_3$ of FIG. 6, we have eliminated the need for an n-well in which to contain the p-channel transistor. This saves additional space.

In FIG. 7, when the main wordline MWL goes high, node $A_i$ and $A_j$ get precharged to $V_{CCP}-N_{VT}$, where $V_{CCP}$ is a voltage above the $V_{CC}$ supply voltage and $N_{VT}$ is the threshold voltage of an N-channel transistor. When the main wordline MWL is driven to $V_{CCP}$, the wordlines go to the associated $F_X$ voltage. If $F_{Xi}$ transitions to $V_{CCP}$, then $WL_i$ will be driven to $V_{CCP}$. Node $A_i$ is booted above $V_{CCP}$ as long as $F_{Xi}$ goes high after node $A_i$ is precharged. Ideally, node $A_i$ would go to $2V_{CCP}-N_{VT}$. For the selected condition, WL goes to $V_{CCP}$ since there is no current through transistor $T_{1i}$ when the source of transistor $T_{1i}$ is MWL when MWL is at $V_{CCP}$. For the case where any $F_X$ is low, the associated WL is held low through $T_2$. Although transistor $T_1$ is trying to pull the wordline WL above ground, its current is limited by the BLEED potential on the gate and transistor $T_1$ will easily hold the WL wordline close to ground. In this fashion, the bleed device $T_1$ uses a small amount of current to maintain the wordlines at a low voltage when they are unselected.

When turning a wordline WL off, the appropriate $F_X$ signal must go to ground before the MWL main wordline goes low. For a triple interconnect process, main wordlines MWL can run parallel to the row direction. The $F_{Xi}$ could also run parallel to the wordlines WL for power-saving reasons.

One design consideration is to minimize coupling effects of adjacent word lines WLs. WLs that are adjacent to those switching high or low need to be maintained at ground. Although there are multiple ways to do this one method would be to have adjacent WLs controlled by different MWLs. For this case, adjacent decodes could have different BLEED signals that would have states opposite to the MWL state for the same decode. In this way, adjacent WLs would be actively held at ground by a high BLEED voltage while the selected WL would have its BLEED voltage placing $T_1$ in a resistive state. This scheme maximizes the current capability of WLs adjacent to the selected WL, while minimizing the current through the selected WL.

Figure 8:
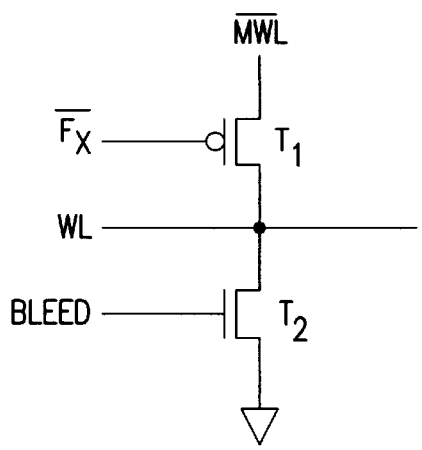
FIG. 8 is an electrical schematic diagram of a portion of a wordline driver of another embodiment of the present invention.

Another simple decoder that uses a bleed mechanism is shown in FIG. 8. In this embodiment, the BLEED potential is modulated by a control circuit (not shown). When discharging the wordline WL to ground, BLEED should be raised to a higher potential such as $V_{CC}$ or $V_{CCP}$. When a wordline WL is active, the BLEED line must be at a potential that limits the current through transistor $T_1$. BLEED could be a decoded signal such that for all decoders that have $F_X$ high, then their associated BLEED potentials would be high. This helps with any concerns with holding the wordlines low next to a wordline that is going active or high. There also may be a concern with having wordlines coupling below ground causing gate induced drain leakage (GIDL) on array cells. Another concern which is actually a benefit is that limiting the pull-down current for wordline drivers using the $T_1$ transistor in standby may be another method to address row-to-column shorts. A row-to-column short increases standby current because the row is grounded and the column or digit line is at $\frac{1}{2}V_{CC}$. However, if the row is being weakly held to ground with the present invention, then the current will be limited.

One method to assist in desensitizing the wordlines from the coupling with adjacent wordlines is to take advantage of subarray architectures that interleave row drivers such that odd rows are driven from one side of the subarray and even drivers are driven from the other side of the subarray. In this architecture, odd-BLEED and even-BLEED signals are used and modulated. When an odd row is selected, the even-BLEED signal is driven high (active) and the odd-BLEED signal is driven low (unselected) or places $T_2$ in a resistive state. When an even row is selected, the odd-BLEED signal is driven high (active) and the even-BLEED signal is driven low (unselected).

Figure 9:
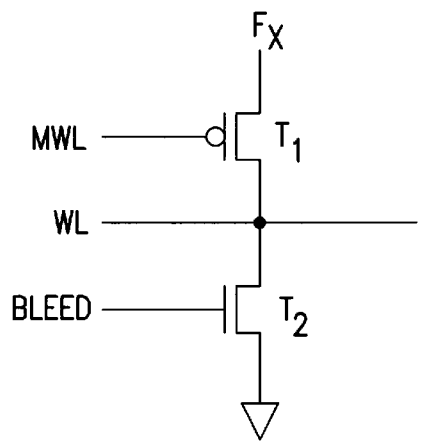
FIG. 9 is an electrical schematic diagram of a portion of a wordline driver of another embodiment of the present invention.

Another embodiment which is a variation of the embodiment shown in FIG. 8 is shown in FIG. 9. In this embodiment, the main wordlines are routed parallel to the wordlines WL and would have the largest number of terms in a decoding scheme. For example, for a 1 of 256 decoder, the main wordline MWL signal could decode 1 of 128 and the $F_X$ signals would decode 1 of 2. The $F_X$ signals could also route parallel to the wordlines or perpendicular.

Figure 10:
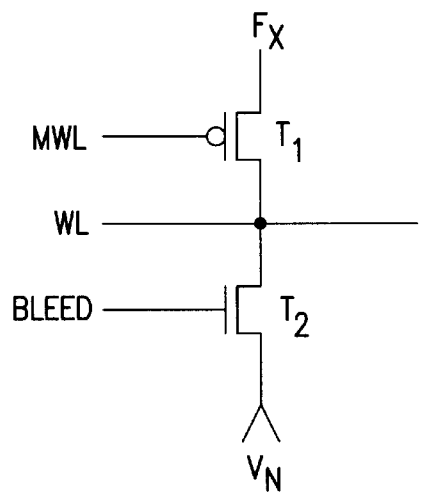
FIG. 10 is an electrical schematic diagram of a portion of a wordline driver of another embodiment of the present invention.

Another aspect of the decoders shown in FIGS. 8 and 9 is that they are easily adapted for negative wordline decoding voltages. FIG. 10 shows a variant on this adaptation where negative wordline voltages are used in the address decoders. This adaptation to negative voltage operation is simplified in the present invention because no negative voltage level translation is necessary in the earlier pre-decoding stages. Only the BLEED signal voltage may need to be translated. The BLEED signal may or may not be required to be negative depending upon the $V_T$ of the N-channel transistors. For a negative decoder, the source of the N-channel transistors would have a negative supply $V_N$ rather than ground $V_{SS}$.

Applications of the Present Invention

Figure 11:
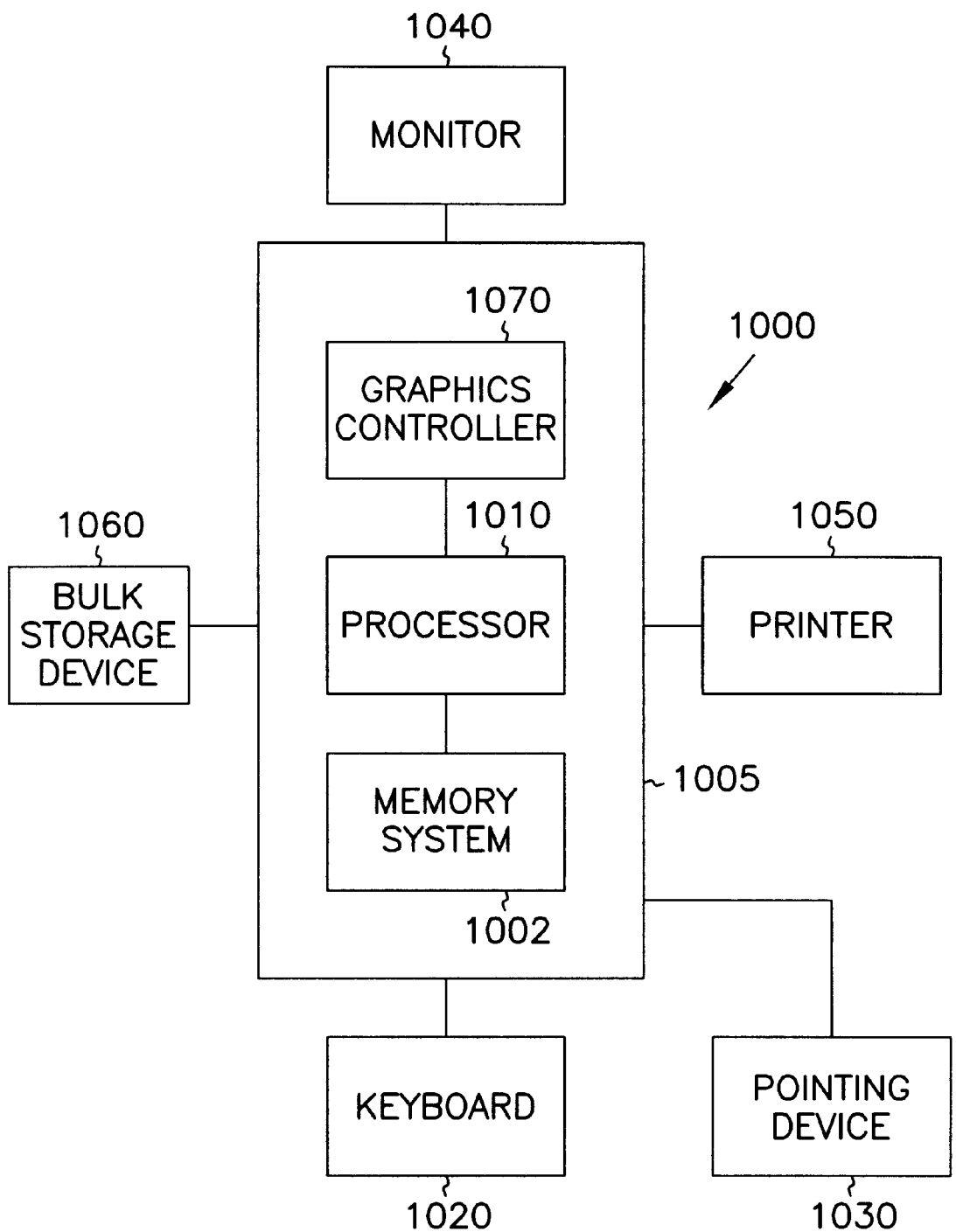
FIG. 11 is a block diagram of a system containing a memory device according to another embodiment of the present invention.

FIG. 11 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 includes a memory device that includes the multiple-mode output driver as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit. Any of these components of the system may contain a memory device that includes the multiple-mode output driver of the present invention. This is particularly true of a graphics subsystem 1070 of FIG. 11 utilizing SGRAM that includes the multiple-mode output driver as discussed in various embodiments of the present invention.

Figure 12:
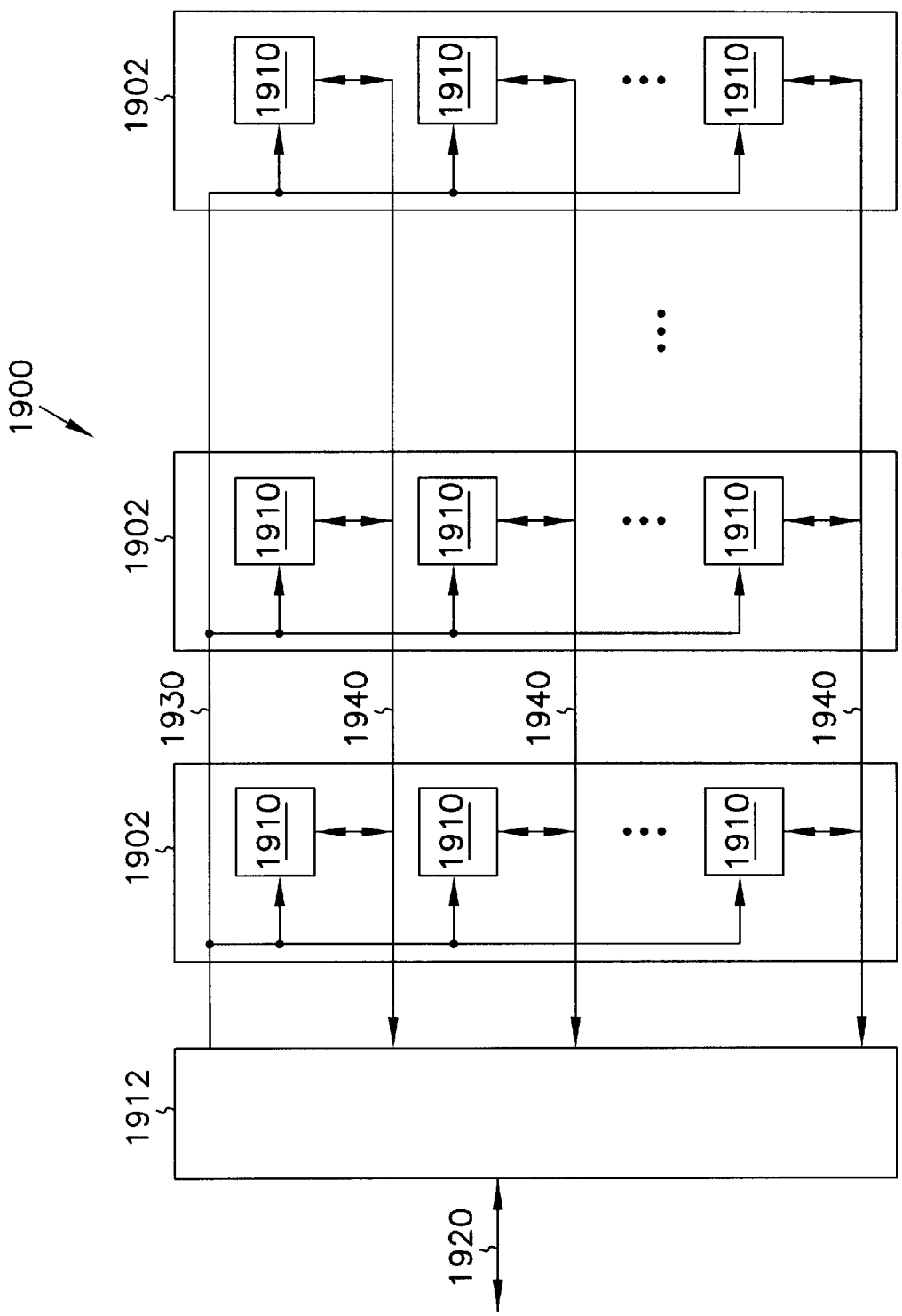
FIG. 12 is a block diagram of a system containing a memory device according to another embodiment of the present invention.

FIG. 12 is a block diagram of a system according to one embodiment of the present invention. Memory system 1900 contains one or more memory modules 1902 and a memory controller 1912. Each memory module 1902 includes at least one memory device 1910. Memory controller 1912 provides and controls a bidirectional interface between memory system 1900 and an external system bus 1920. Memory system 1900 accepts a command signal from the external bus 1920 and relays it to the one or more memory modules 1902 on a command link 1930. Memory system 1900 provides for data input and data output between the one or more memory modules 1902 and external system bus 1920 on data links 1940. At least one of the memory devices 1910 includes the multiple-mode output driver as discussed in various embodiments of the present invention.

CONCLUSION

It will be understood by those skilled in the art that the circuits and signals described above in the various embodiments of the present invention are illustrative and that their implementation can take on many variations without departing from the spirit and scope of the claimed invention. For example, although some signals have been described as active-low or low-active, one skilled in the art will readily recognize that this is a design convention which is a matter of choice and convenience and that active-high signals may be substituted therefor. In a similar fashion, active-high signals are also readily substitutable for active-low signals. Thus, negative or positive logic conventions, active-high or active-low signals, positive or negative voltages, p-channel or n-channel transistors, and many other complementary systems may be used with the present invention without departing from the claimed invention or limiting the equivalents of the present invention.

It will further be understood that the above description of a DRAM (Dynamic Random Access Memory) is intended to provide a general understanding of the memory device and is not a complete description of all the elements and features of a DRAM. Further, the invention is equally applicable to any size and type of memory circuit and is not intended to be limited to the DRAM described above. Other alternative types of devices include SDRAM (Synchronous Dynamic Random Access Memory), SRAM (Static Random Access Memory) or Flash memories. Additionally, the memory device could be SGRAM (Synchronous Graphics Random Access Memory), SDRAM II, and DDR SDRAM (Double Data Rate SDRAM), as well as Synchlink or Rambus DRAMs and other emerging memory technologies.

Figure 13:
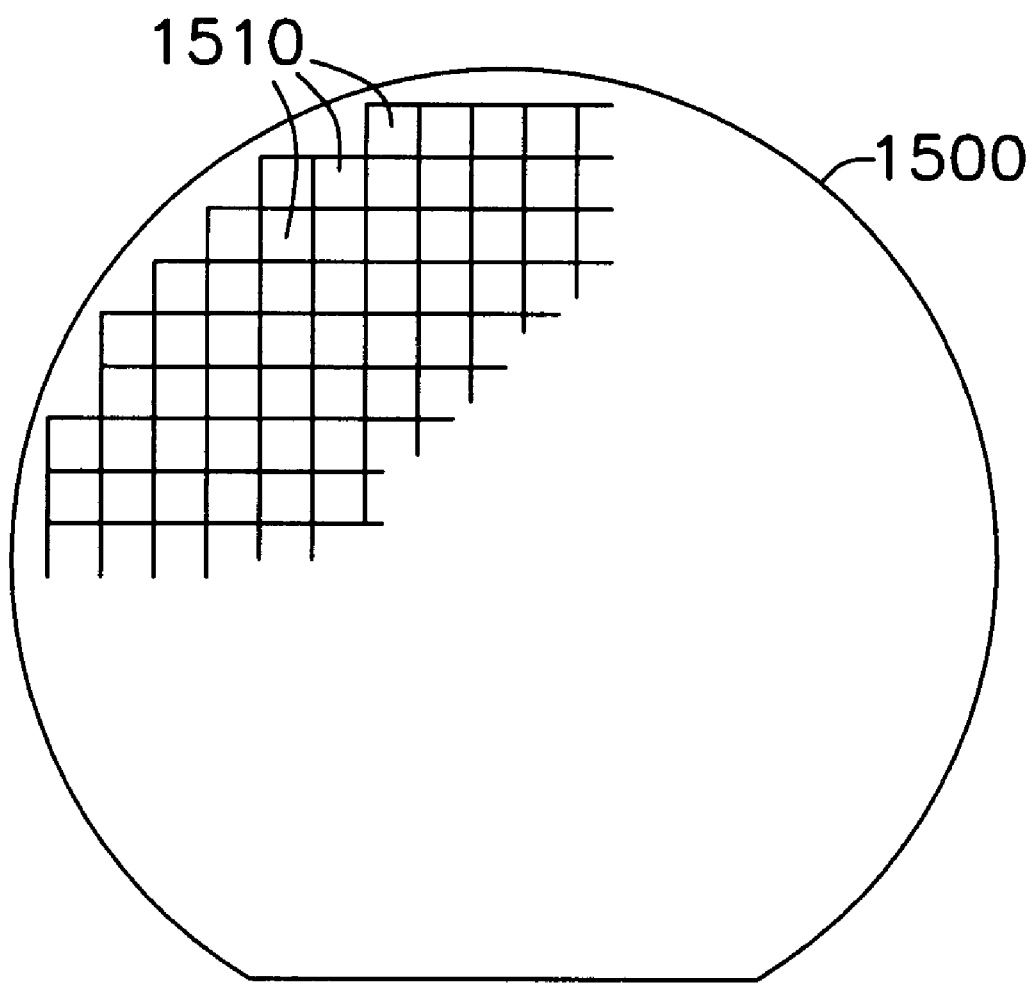
FIG. 13 is an elevation view of a semiconductor wafer containing the present invention according to another embodiment of the present invention.

As recognized by those skilled in the art, memory devices of the type described herein are generally fabricated on a wafer as an integrated circuit containing a variety of semiconductor devices as shown in FIG. 13. The integrated circuit is supported by a substrate 1500. Integrated circuits are typically repeated multiple times on each substrate 1510. The substrate is further processed to separate the integrated circuits into dies as is well known in the art.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

What is claimed is:

1. A decoder with reduced area on an integrated circuit, comprising:
    a select transistor receiving a select signal to selectively strongly hold a decoder wordline output to a first voltage; and
    a bleed transistor having a common gate configuration with at least another bleed transistor of another decoder, the bleed transistor receiving a bleed signal to weakly hold the decoder wordline output to a second voltage.

2. The decoder of claim 1, wherein the bleed signal is one of two conditions selected from a group consisting of static and modulated.

3. A decoder occupying a reduced area on an integrated circuit, comprising:
    a first transistor receiving a first select signal and a second select signal, and operable for connecting the first select signal to a wordline when the second select signal is in a first logic state;
    a second transistor receiving the second select signal to strongly hold the wordline to a voltage when the second select signal is in a second logic state; and
    a bleed transistor having a common gate configuration with other bleed transistors of other decoders, the bleed transistor receiving a bleed signal to weakly hold the wordline to the voltage.

4. The decoder of claim 3, wherein the bleed transistor is only active when the second select signal is in the first logic state and the first select signal is unselected.

5. A decoder with reduced area on an integrated circuit, comprising:
    an address decoder having a decoder wordline output;
    a select transistor receiving a select signal to connect the decoder wordline output to a main line; and
    a bleed transistor having a common gate configuration with at least another bleed transistor of another address decoder, the bleed transistor receiving a bleed signal to hold the wordline to a voltage.

6. The decoder of claim 5, wherein the bleed signal is one of two conditions selected from a group consisting of static and modulated.

7. The decoder of claim 5, wherein the main line is a main wordline and the decoder wordline output is a pre-decoded address signal.

8. An address decoder control circuit occupying a reduced area on an integrated circuit, comprising:
   a first transistor receiving a select signal to connect a pre-decoded output signal from an address decoder to a wordline when the first select signal is in a first state;
   a second transistor receiving the select signal to strongly hold the wordline to a voltage when the select signal is in a second state; and
   a bleed transistor having a common gate configuration with other bleed transistors of other address decoders, the bleed transistor receiving a bleed signal to weakly hold the wordline to the voltage.

9. The decoder of claim 8, wherein the bleed signal is only on when the select signal is in the first state and the pre-decoded output signal is unselected.

10. A wordline select circuit, comprising:
    a decoded address signal;
    a select transistor receiving the decoded address signal and operable to connect a decoder output to a wordline when the decoded address signal is in a selected state, and
    a bleed transistor having a common gate configuration with other bleed transistors, the bleed transistor receiving a bleed signal to weakly hold the wordline to an unselected state.

11. The wordline select circuit of claim 10 wherein the bleed signal only activates the bleed transistor when the decoded address signal is in an unselected state.

12. A memory device on an integrated circuit, comprising:
    an array of memory cells that is accessed by a set of address decoders, each of the address decoders includes:
    a select transistor receiving a select signal to selectively strongly hold a decoder output wordline in a selected state; and
    a bleed transistor having a common gate configuration with other bleed transistors of other decoders, the bleed transistor receiving a bleed signal to weakly hold the decoder output wordline to an unselected state.

13. The memory device of claim 12, wherein the set of address decoders is divided into a first subset of decoders to drive wordlines that access odd rows of memory cells and a second subset of decoders to drive wordlines that access even rows of memory cells.

14. The memory device of claim 12, wherein the set of address decoders is divided into a first subset of decoders and a second subset of decoders, the decoders connected to access alternating rows of memory cells.

15. The memory device of claim 13, wherein the first subset of decoders is adapted to receive a first bleed signal and the second subset of decoders is adapted to receive a second bleed signal.

16. The memory device of claim 15, such that when an odd row is selected by one decoder of the first subset of decoders, the second bleed signal acts to hold at least one bleed transistor of the second subset of decoders unselected, and wherein when an even row is selected by one decoder of the second subset of decoders, the first bleed signal acts to hold at least one bleed transistor of the first subset of decoders unselected.

17. The memory device of claim 16, wherein the set of decoders is interleaved so as to inhibit undesired coupling of an inactive wordline when another wordline is activated.

18. The memory device of claim 12, wherein the bleed transistor limits pull down current in standby thus reducing standby current contribution due to row to column shorts.

19. A memory device on an integrated circuit, comprising:
    an array of memory cells that is accessed by a set of address decoders, each of the address decoders includes:
    a select circuit receiving a predecoded address signal to strongly pull a wordline to a selected state; and
    a bleed circuit having a common gate configuration with other bleed circuits of other address decoders, the bleed transistor receiving a bleed signal to weakly hold the wordline to an unselected state.

20. The memory device of claim 19, wherein the set of address decoders is divided into a first subset of decoders to drive wordlines that access odd rows of memory cells and a second subset of decoders to drive wordlines that access even rows of memory cells.

21. The memory device of claim 20, wherein the first subset of decoders is located on one side of the memory array and the second subset of decoders is located on the side opposite from the one side of the memory array.

22. The memory device of claim 20, wherein the first subset of decoders is adapted to receive an odd-bleed signal and the second subset of decoders is adapted to receive an even-bleed signal.

23. The memory device of claim 22, such that when an odd row is selected by one decoder of the first subset of decoders, the even-bleed signal is activated to hold even wordlines unselected, and when an even row is selected by one decoder of the second subset of decoders, the odd-bleed signal is activated to hold even wordlines unselected.

24. A decoder circuit with reduced area, comprising:
    a first transistor having a gate, a drain, and a source, wherein the gate receives a first predecoded signal, wherein the drain defines an output that presents a word line signal, and wherein the source receives a second pre-decoded signal;
    a second transistor having a gate, a drain, and a source, wherein the gate of the second transistor couples to the gate of the first transistor to receive the first pre-decoded signal, wherein the drain of the second transistor couples to the drain of the first transistor, and wherein the source of the second transistor couples to ground; and
    a bleeder transistor having a gate, a drain, and a source, wherein the gate of the bleeder transistor receives a bleeding signal, which is presented to at least another bleeder transistor of another decoder, wherein the drain of the bleeder transistor couples to the drain of the first transistor, and wherein the source of the bleeder transistor couples to ground.

25. The decoder circuit of claim 24, wherein the first transistor includes a p-channel metal-oxide semiconductor transistor, wherein the second transistor includes an n-channel metal-oxide semiconductor transistor, and wherein the bleeder transistor includes an n-channel metal-oxide semiconductor transistor.

26. The decoder circuit of claim 25, wherein a voltage level of the bleeding signal is selected such that the bleeder transistor bleeds charge at the output to ground when the first pre-decoded signal is inactive and the second pre-decoded signal is inactive.

27. The decoder circuit of claim 26, wherein a voltage level of the bleeding signal is selected such that the output is pulled up to near the voltage level of the second pre-decoded signal when the output is active.

28. The decoder circuit of claim 27, wherein the bleeder transistor bleeds the charges at a rate that inhibits the coupling of the output to move above ground when another output of another decoder within the vicinity of the decoder circuit goes active.

29. A method for decoding with a decoder having reduced area, comprising:

connecting a predecoded address signal to a wordline;

weakly bleeding charge from the wordline when the predecoded address signal is in an unselected state; and overcoming the bleeding charge by strongly pulling the wordline to a voltage when the predecoded address signal is in a selected state.

30. A method for decoding with a decoder having reduced area, comprising:

selectively connecting a predecoded address signal to a wordline if a wordline select signal is in a selected state;

weakly bleeding charge from the wordline; and overcoming the bleeding charge by strongly pulling the wordline to a voltage when the predecoded address signal is in a selected state.

31. The method of claim 30, further comprising strongly pulling the wordline to ground when the wordline select signal is in an unselected state.

32. The method of claim 31, wherein weakly bleeding further includes weakly bleeding only when the predecoded address signal is in an unselected state.

33. A method for controlling wordlines, comprising:

connecting a predecoded address signal to a wordline if a wordline select signal is in a selected state;

holding the wordline to ground when the predecoded address signal is in the unselected state; and strongly pulling the wordline to a voltage when the predecoded address signal is in a selected state.

34. The method of claim 33, wherein the holding of the wordline includes weakly bleeding the charge from the wordline when the predecoded address signal is in an unselected state.

35. The method of claim 34, wherein the weakly bleeding includes controlling the rate of charge bleeding with a bleed signal.

36. The method of claim 35, further including choosing a voltage level for the bleed signal to bleed a desired level of current so that the wordline is at ground when the wordline is unselected.

37. The method of claim 36, wherein choosing the voltage level of the bleed signal to bleed charges at a rate such that the current through a bleeder is large enough to inhibit undesired coupling of the wordline above ground when another wordline goes above or below ground.

38. The method of claim 33, wherein holding the wordline includes limiting pull down current in standby thus reducing standby current contribution due to row to column shorts.

39. A method for address decoding, comprising:

producing a predecoded address signal;

producing a wordline select signal;

connecting the predecoded address signal to the wordline when the wordline select signal is in a selected state; and holding the wordline to an unselected state when the predecoded address signal is in the unselected state.

40. The method of claim 39, wherein holding the wordline includes limiting the pull down current in standby thus reducing the standby current contribution due to row to column shorts.

\* \* \* \* \*

UNITED STATES PATENT AND TRADEMARK OFFICE
CERTIFICATE OF CORRECTION

PATENT NO. : 6,556,503 B2
DATED : April 29, 2003
INVENTOR(S) : Schreck

It is certified that error appears in the above-identified patent and that said Letters Patent is hereby corrected as shown below:

Column 8,
Line 53, delete "To" and insert -- $T_1$ --, therefor.

Column 9,
Line 32, delete "$\overline{F}_X$" and insert -- $F_X$ --, therefor.

Signed and Sealed this

Third Day of February, 2004

JON W. DUDAS
*Acting Director of the United States Patent and Trademark Office*